United States Patent [19]

Chun et al.

[11] Patent Number: 5,602,548
[45] Date of Patent: Feb. 11, 1997

[54] DATA OUTPUT APPARATUS FOR VARIABLE LENGTH DECODER

[75] Inventors: Sung M. Chun; Geum O. Lee, both of Seoul, Rep. of Korea

[73] Assignee: Hyundai Electronics Industries Co., Ltd., Kyoungki-do, Rep. of Korea

[21] Appl. No.: 341,126

[22] Filed: Nov. 18, 1994

[30] Foreign Application Priority Data

Dec. 29, 1993 [KR] Rep. of Korea ............ 93-30544

[51] Int. Cl.[6] .............................................. H04N 7/133
[52] U.S. Cl. .............................................. 341/67; 348/423
[58] Field of Search .............................. 341/67, 50, 55; 348/423

[56] References Cited

U.S. PATENT DOCUMENTS

| | | | |
|---|---|---|---|
| 5,086,439 | 2/1992 | Asai et al. | |
| 5,122,875 | 6/1992 | Raychaudhuri | 358/133 |
| 5,414,468 | 5/1995 | Lee | 348/402 |

Primary Examiner—Jeffrey A. Gaffin
Assistant Examiner—Peguy JeanPierre
Attorney, Agent, or Firm—Wigman, Cohen, Leitner & Myers, P.C.

[57] ABSTRACT

A data output apparatus for a variable length decoder comprises a variable length decoding controller for outputting an address value, a general data enable signal and a video data enable signal in response to a variable length decoding control signal and a clock signal, a general data output unit for rearranging variable length-decoded general data in response to the general data enable signal and outputting the rearranged general data in response to the clock signal, and a video data output unit for rearranging variable length-decoded video data in response to the video data enable signal and outputting the rearranged video data in response to the clock signal. The general data output unit includes a selector for rearranging the variable length-decoded general data in response to a plurality of control signals, and a general data output controller for outputting the plurality of control signals to the selector in response to the general data enable signal. The video data output unit includes a selector for rearranging the variable length-decoded video data in response to a plurality of control signals, and a video data output controller for outputting the plurality of control signals to the selector in response to the video data enable signal, a video data escape active signal and a video data clear signal.

8 Claims, 4 Drawing Sheets

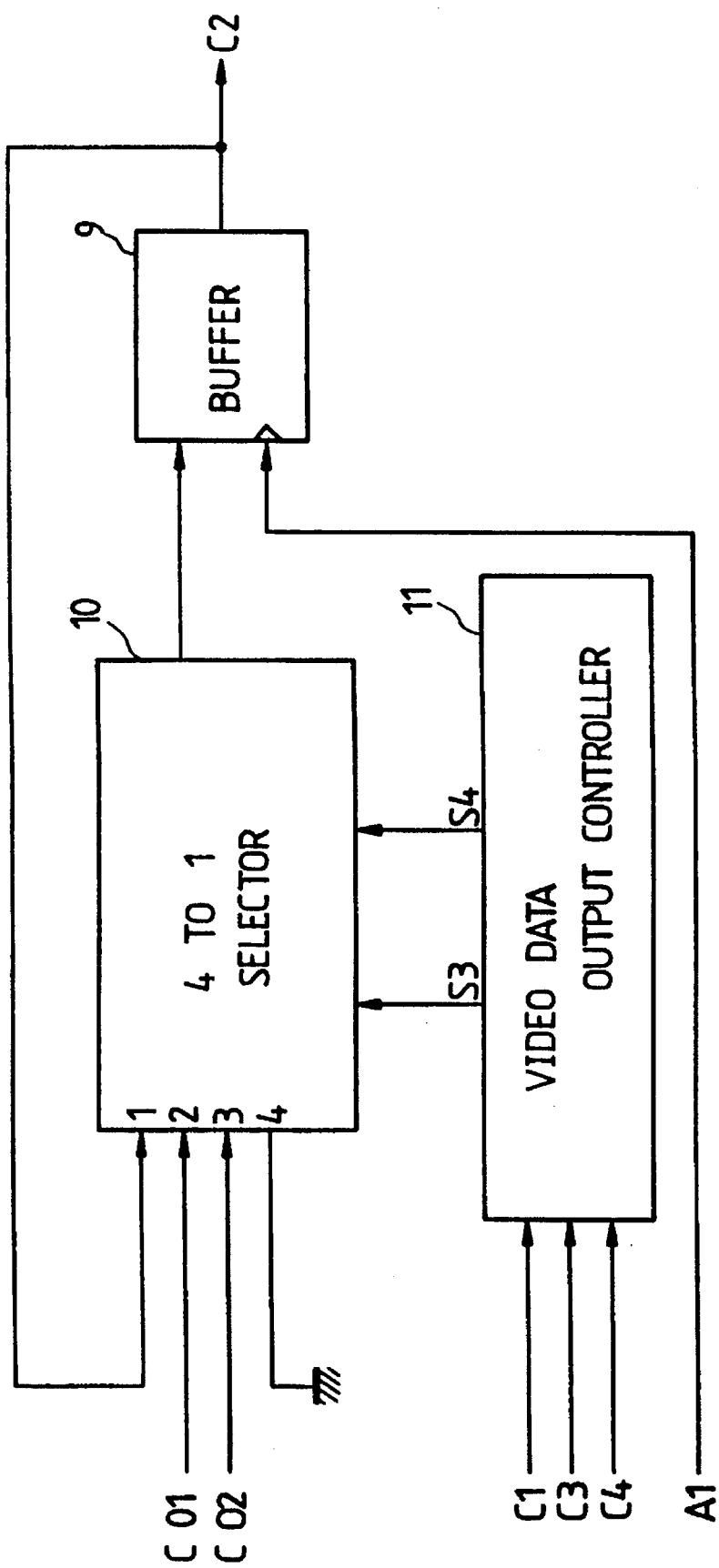

DATA OUTPUT APPARATUS FOR VARIABLE LENGTH DECODER

BACKGROUND OF THE INVENTION

1. Field of the Invention

The present invention relates to a data output apparatus for a variable length decoder which is capable of rearranging variable length-decoded video data and other data in a desired order and outputting the rearranged data.

2. Description of the Prior Art

A conventional data output apparatus for a variable length decoder outputs input data directly in an input order. As a result, an amount of the input data per unit time is the same as that of the output data per unit time. This results in an inefficiency in data output time.

On the other hand, a technique for enhancing a performance of the variable length decoder is shown in U.S. Pat. No. 5,086,439. This technique is adapted to sequentially decode sequentially encoded input digital signal according to the input digital signal and a frequency therefrom, to enhance an efficiency of a variable length encoding/decoding system. However, the above technique is desirable to perform the encoding and decoding operations of the variable length encoding/decoding system more accurately and fast, but not applicable to a system for outputting effectively the variable length-decoded data.

SUMMARY OF THE INVENTION

Therefore, the present invention has been made in view of the above problem, and it is an object of the present invention to provide a data output apparatus for a variable length decoder which is capable of outputting variable length-decoded video data and other data according to a specified code format in a desired order regardless of an input order.

In accordance with the present invention, the above and other objects can be accomplished by a provision of a data output apparatus for a variable length decoder comprising variable length decoding control means for outputting an address value, a general data enable signal and a video data enable signal in response to a variable length decoding control signal and a clock signal; general data output means for rearranging variable length-decoded general data in response to the general data enable signal from said variable length decoding control means and outputting the rearranged general data in response to the clock signal; and video data output means for rearranging variable length-decoded video data in response to the video data enable signal from said variable length decoding control means and outputting the rearranged video data in response to the clock signal.

BRIEF DESCRIPTION OF THE DRAWINGS

The above and other objects, features and advantages of the present invention will be more clearly understood from the following detailed description taken in conjunction with the accompanying drawings, in which:

FIG. 3 is a block diagram of a video data output unit in FIG. 1; and

FIG. 4 is a timing diagram of input and output signals in FIG. 1, wherein:

FIG. 4A is a clock timing diagram;

FIG. 4B is an address timing diagram;

FIG. 4C is a general data output timing diagram; and

FIG. 4D is a video data output timing diagram.

DETAILED DESCRIPTION OF THE INVENTION

Figure 1:
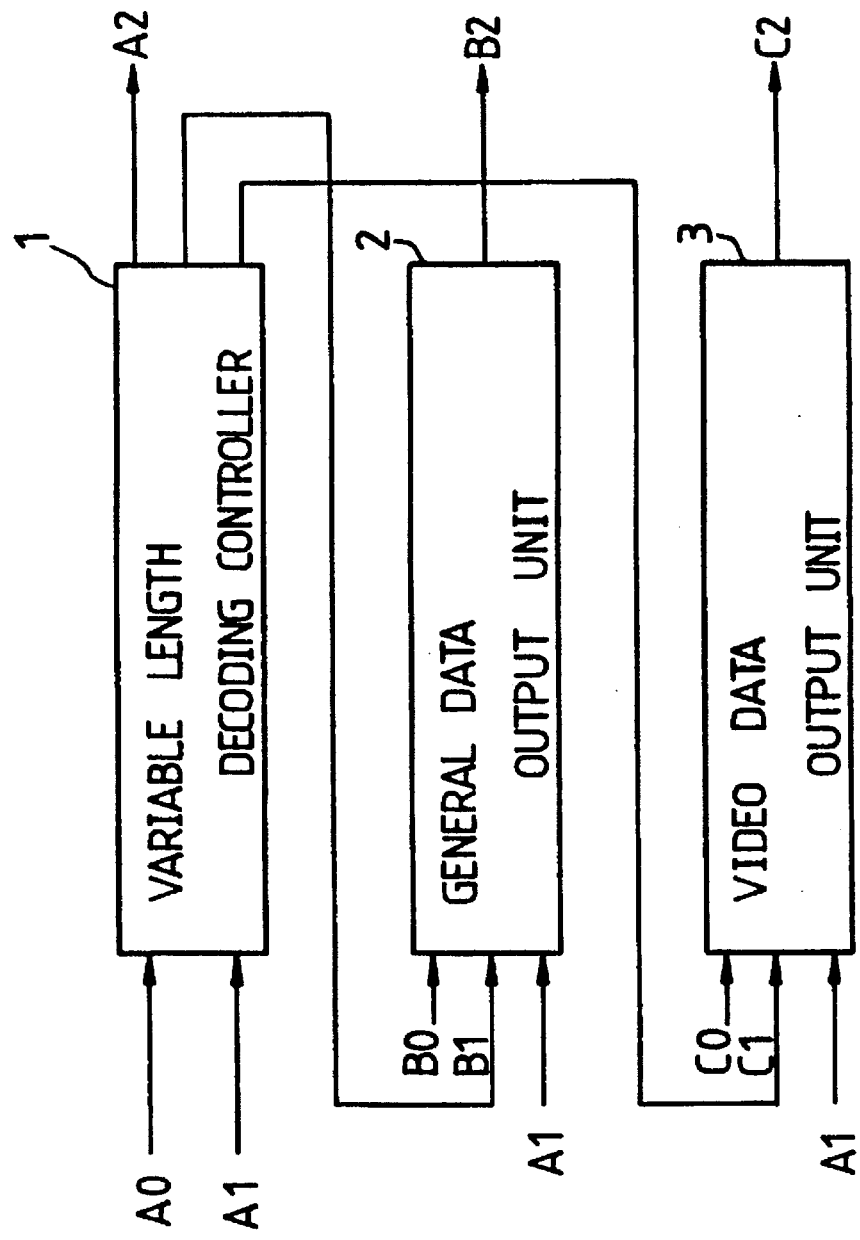
FIG. 1 is a block diagram of a data output apparatus for a variable length decoder in accordance with the present invention.

Referring to FIG. 1, there is shown a block diagram of a data output apparatus for a variable length decoder in accordance with the present invention. As shown in this drawing, the data output apparatus comprises a variable length decoding controller 1 for outputting an address value A2, a general data enable signal B1 and a video data enable signal C1 in response to a variable length decoding control signal A0 and a clock signal A1. The general data enable signal B1 and the video data enable signal C1 from the variable length decoding controller 1 are applied to a general data output unit 2 and a video data output unit 3, respectively.

The general data output unit 2 is adapted to rearrange variable length-decoded general data B0 in response to the general data enable signal B1 from the variable length decoding controller 1 and output the rearranged general data B2 in response to the clock signal A1.

The video data output unit 3 is adapted to rearrange variable length-decoded video data C0 in response to the video data enable signal C1 from the variable length decoding controller 1 and output the rearranged video data C2 in response to the clock signal A1.

Figure 2:
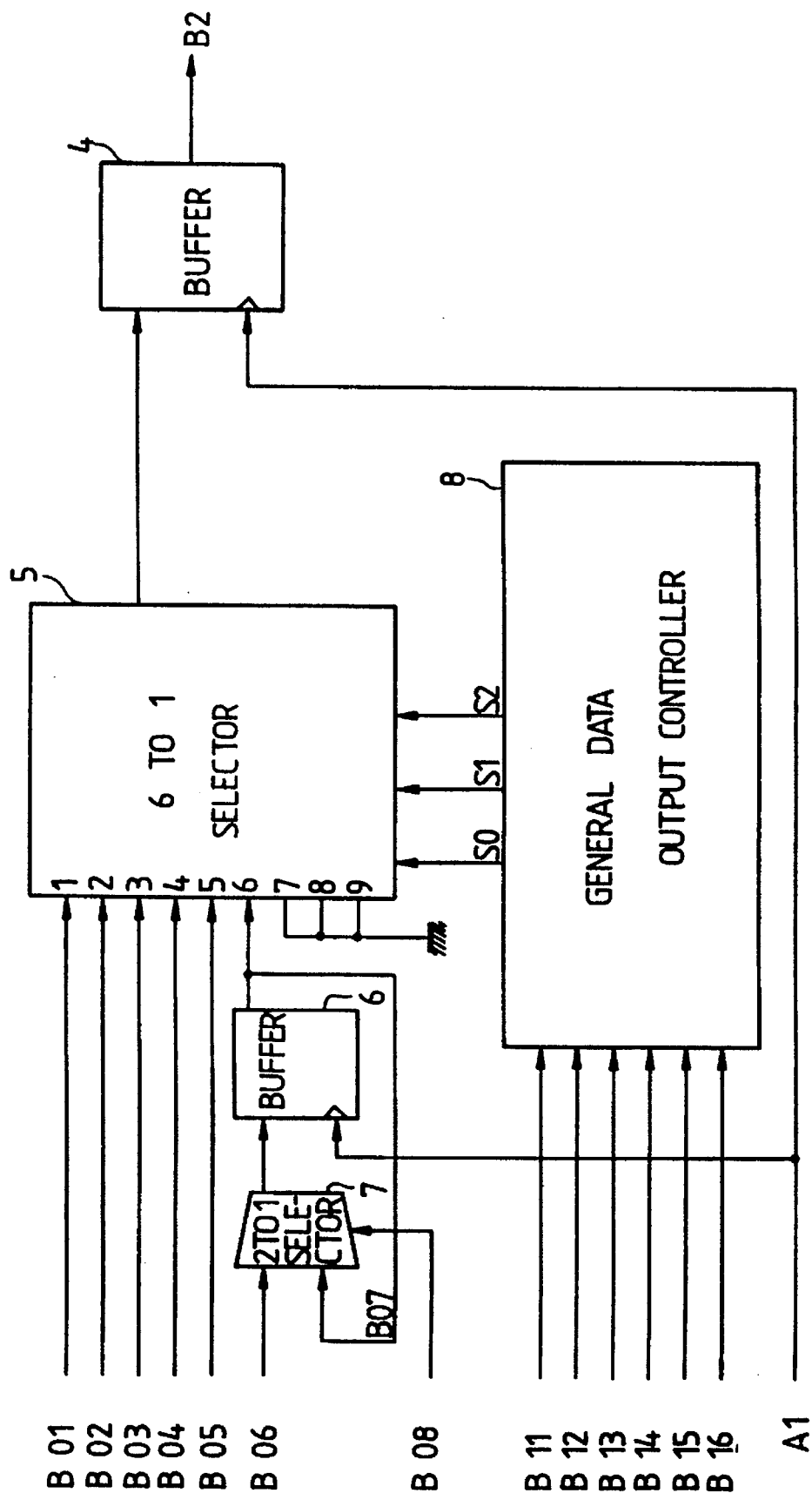
FIG. 2 is a block diagram of a general data output unit in FIG. 1.

Referring to FIG. 2, there is shown a block diagram of the general data output unit 2 in FIG. 1. As shown in this drawing, the general data output unit 2 includes a 6-to-1 selector 5 for rearranging the variable length-decoded general data B0 in response to control signals S0–S2 and outputting the rearranged general data B2. The variable length-decoded general data B0 includes a slice vertical position signal B01, a slice quantization signal B02, an X-axis motion vector signal B03, a Y-axis motion vector signal B04, a macro block number signal B05 and a macro block type signal B06.

A buffer 6 is adapted to buffer one of the macro block type signal B06 of the variable length-decoded general data B0 and its output fed back thereto and output the buffered macro block type signal B07 to the 6 to 1 selector 5.

A 2-to-1 selector 7 is adapted to select one of the macro block type signal B06 of the variable length-decoded general data B0 and the buffered macro block type signal B07 from the buffer 6 in response to a macro block type active signal B08 and output the selected macro block type signal to the buffer 6.

A general data output controller 8 is adapted to generate the control signals S0–S2 in response to the general data enable signal B1 from the variable length decoding controller 1 and output the generated control signals S0–S2 to the 6 to 1 selector 5. The general data enable signal B1 includes a slice vertical position enable signal B11, a slice quantization enable signal B12, an X-axis motion vector enable signal B13, a Y-axis motion vector enable signal B14, a macro block number enable signal B15 and a macro block type enable signal B16.

A buffer 4 is adapted to output the rearranged general data B2 from the 6 to 1 selector 5 in response to the clock signal A1.

Referring to FIG. 3, there is shown a block diagram of the video data output unit 3 in FIG. 1. As shown in this drawing, the video data output unit 3 includes a 4-to-1 selector 10 for rearranging the variable length-decoded video data C0 in response to control signals S3 and S4 and outputting the rearranged video data C2. The variable length-decoded video data C0 has a format which is determined according to the rearranged general data B2 from the general data output unit 2, and includes a quantization level C01 which is contained in a variable length code table and an escape level C02 which is not contained in the variable length code table.

A video data output controller 11 is adapted to generate the control signals S3 and S4 in response to the video data enable signal C1 from the variable length decoding controller 1, a video data escape active signal C3 and a video data clear signal C4 and output the generated control signals S3 and S4 to the 4 to 1 selector 10. Upon inputting the video data clear signal C4, the video data output controller 11 is cleared. Then, upon inputting sequentially the video data enable signal C1 and the video data escape active signal C3, the video data output controller 11 controls the 4-to-1 selector 10 to output the escape level C02. Also, upon inputting only the video data enable signal C1 under the condition of being cleared, the video data output controller 11 controls the 4-to-1 selector 10 to output the quantization level C01. On the other hand, if the video data output controller 11 does not input the video data clear signal C4 again, it controls the 4-to-1 selector 10 to output the previous data.

The buffer 9 is adapted to output the rearranged video data C2 from the 4-to-1 selector 10 in response to the clock signal A1.

The variable length-decoded video data C0 includes a direct current (DC) value when a macro block is of an intra type, a variable length-decoded value or the quantization level C01 and an escape code-processed value or the escape level C02. The DC value is processed together with the variable length-decoded value.

The operation of the data output apparatus for the variable length decoder with the above-mentioned construction in accordance with the present invention will hereinafter be described in detail.

Upon inputting the variable length decoding control signal A0 and the clock signal A1, the variable length decoding controller 1 outputs the address value A2, the general data enable signal B1 and the video data enable signal C1. The general data enable signal B1 from the variable length decoding controller 1 is applied to the general data output controller 8 in the general data output unit 2. The general data enable signal B1 includes the slice vertical position enable signal B11, the slice quantization enable signal B12, the X-axis motion vector enable signal B13, the Y-axis motion vector enable signal B14, the macro block number enable signal B15, and the macro block type enable signal B16.

In the general data output unit 2, the general data output controller 8 generates the control signals S0–S2 in response to the slice vertical position enable signal B11, the slice quantization enable signal B12, the X-axis motion vector enable signal B13, the Y-axis motion vector enable signal B14, the macro block number enable signal B15, and the macro block type enable signal B16 from the variable length decoding controller 1, and outputs the generated control signals S0–S2 to the 6 to 1 selector 5.

The variable length-decoded general data B0 includes the slice vertical position signal B01, the slice quantization signal B02, the X-axis motion vector signal B03, the Y-axis motion vector signal B04, the macro block number signal B05 and the macro block type signal B06. The macro block type signal B06 of the variable length-decoded general data B0 is applied as the buffered macro block type signal B07 to the 6 to 1 selector 5 through the 2-to-1 selector 7 and the buffer 6.

In response to the control signals S0–S2 from the general data output controller 8, the 6-to-1 selector 5 rearranges the variable length-decoded general data B0 in the order of the slice vertical position signal B01, the slice quantization signal B02, the macro block number signal B05, the buffered macro block type signal B07, the X-axis motion vector signal B03 and the Y-axis motion vector signal B04. The rearranged general data B2 from the 6-to-1 selector 5 is finally outputted through the buffer 4 in response to the clock signal A1.

Also, the video data enable signal C1 from the variable length decoding controller 1 is applied to the video data output controller 11 in the video data output unit 3, which also inputs the video data escape active signal C3 and the video data clear signal C4. The variable length-decoded video data C0 has a format which is determined according to the rearranged general data B2 from the buffer 4 of the general data output unit 2, and includes the DC value when the macro block is of the intra type, the variable length-decoded value or the quantization level C01, and the escape code-processed value or the escape level C02. The DC value is processed together with the variable length-decoded value. The quantization level C01 is contained in the variable length code table, and the escape level C02 is not contained in the variable length code table. In result, the quantization level C01 and the escape level C02 of the variable length-decoded video data C0 are applied to the 4-to-1 selector 10 and then rearranged thereby under the control of the video data output controller 11 which is operated in response to the video data enable signal C1 from the variable length decoding controller 1, the video data escape active signal C3 and the video data clear signal C4.

Namely, upon inputting the video data clear signal C4, the video data output controller 11 is cleared. Then, upon inputting sequentially the video data enable signal C1 and the video data escape active signal C3, the video data output controller 11 controls the 4-to-1 selector 10 to output the escape level C02. Also, upon inputting only the video data enable signal C1 under the condition of being cleared, the video data output controller 11 controls the 4-to-1 selector 10 to output the quantization level C01. On the other hand, in the case where the video data output controller 11 does not input the video data clear signal C4 again, it controls the 4-to-1 selector 10 to output the previous data.

The operation of the data output apparatus for the variable length decoder in accordance with the present invention will hereinafter be described in more detail with reference to FIGS. 4A to 4D, which are timing diagrams of the input and output signals in FIG. 1.

Each address value A2 of 4 bits as shown in FIG. 4B is generated from the variable length decoding controller 1 in response to the clock signal A1 as shown in FIG. 4A. The rearranged general data B2 of every 8 bits as shown in FIG. 4C is generated from the general data output unit 2 according to the generated address value A2. Then, when the address value A2 becomes "0" according to the video data clear signal C4, the rearranged video data C2 of every 8 bits as shown in FIG. 4D is generated from the video data output unit 3.

The 6-to-1 selector 5 in the general data output unit 2 outputs the six signals of the variable length-decoded general data B0 in the desired order under the control of the general data output controller 8 which is operated in response to the six signals of the general data enable signal B1 from the variable length decoding controller 1. Namely, as shown in FIG. 4C, the 6-to-1 selector 5 outputs the variable length-decoded general data B0 in the order of the slice vertical position signal B01, the slice quantization signal B02, the macro block number signal B05, the buffered macro block type signal B07, the X-axis motion vector signal B03 and the Y-axis motion vector signal B04. Here, each of the slice vertical position signal B01, the slice quantization signal B02, the macro block number signal B05 and the buffered macro block type signal B07 has 6 bits, and each of the X-axis motion vector signal B03 and the Y-axis motion vector signal B04 has 4 bits. Because the data output is performed in the unit of 8 bits, the empty 2 bits of each signal of the variable length-decoded general data B0 are filled with "0" beginning with a most significant bit. Also, 2 sign bits are outputted, being added to each of the X-axis motion vector signal B03 and the Y-axis motion vector signal B04. For this reason, 2 unnecessary bits or the filled bits are in practice present in every output data. On the other hand, the variable length-decoded video data C0 is rearranged by the video data output unit 3 by the format determined according to the rearranged general data 52 from the general data output unit 2. Namely, when the address value A2 becomes "0" or the video data clear signal C4 is applied, the variable length-decoded video data C0 is rearranged in the order of data 0 (D0), data 1 (D1), data 2 (D2), data 3 (D3), data 4 (D4), data 5 (D5), . . . , as shown in FIG. 4D.

As is apparent from the above description, according to the present invention, an amount of the output data per unit time becomes greater than that of the input data per unit time. Therefore, the variable length-decoded video data and other data can be rearranged in the desired order for the data output.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A data output apparatus for a variable length decoder comprising:

variable length decoding control means for outputting an address value, a general data enable signal and a video data enable signal in response to a variable length decoding control signal and a clock signal;

general data output means for rearranging variable length-decoded general data in response to the general data enable signal from said variable length decoding control means and for outputting the rearranged general data in response to the clock signal; and video data output means for rearranging variable length-decoded video data in response to the video data enable signal from said variable length decoding control means and for outputting the rearranged video data in response to the clock signal;

wherein said general data output means includes:

a first selector for rearranging the variable length-decoded general data in response to a plurality of control signals and for outputting the rearranged general data, said variable length-decoded general data including a slice vertical position signal, a slice quantization signal, an X-axis motion vector signal, a Y-axis motion vector signal, a macro block number signal and a macro block type signal;

a first buffer for buffering one of the macro block type signal of the variable length-decoded general data and its output fed back thereto and for outputting the buffered macro block type signal to said first selector;

a second selector for selecting one of the macro block type signal of the variable length-decoded general data and the buffered macro block type signal from said first buffer in response to a macro block type active signal and for outputting the selected macro block type signal to said first buffer;

a general data output controller for generating said plurality of control signals in response to the general data enable signal from said variable length decoding control means and for outputting the generated control signals to said first selector; and a second buffer for outputting the rearranged general data from said first selector in response to the clock signal.

2. A data output apparatus for a variable length decoder as set forth in claim 1, wherein said general data output controller is operated to generate said plurality of control signals in response to the general data enable signal from said variable length decoding control means and to output the generated control signals to said first selector, said general data enable signal from said variable length decoding control means including a slice vertical position enable signal, a slice quantization enable signal, an X-axis motion vector enable signal, a Y-axis motion vector enable signal, a macro block number enable signal and a macro block type enable signal, and wherein said first selector is operated to rearrange the variable length-decoded general data in the order of the slice vertical position signal, the slice quantization enable signal, the macro block number signal, the buffered macro block type signal, the X-axis motion vector signal and the Y-axis motion vector signal in response to the control signals from said general data output controller.

3. A data output apparatus for a variable length decoder as set forth in claim 2, wherein, because each of the slice vertical position signal, the slice quantization signal, the macro block number signal and the buffered macro block type signal has 6 bits, and each of the X-axis motion vector signal and the Y-axis motion vector signal has 4 bits, and the data output is performed in a unit of 8 bits, an empty 2 bits of each of the slice vertical position signal, the slice quantization signal, the macro block number signal, the buffered macro block type signal, the X-axis motion vector signal and the Y-axis motion vector signal are filled with "0" beginning with a most significant bit, and 2 sign bits are added to each of the X-axis motion vector signal and the Y-axis motion vector signal.

4. A data output apparatus for a variable length decoder as set forth in claim 1, wherein said video data output means includes:

a selector for rearranging the variable length-decoded video data in response to a plurality of control signals and for outputting the rearranged video data, said variable length-decoded video data having a format which is determined according to the rearranged general data from said general data output means;

a video data output controller for generating said plurality of control signals in response to the video data enable signal from said variable length decoding means, a video data escape active signal, and a video data clear signal and outputting the generated control signals to said selector; and for a buffer for outputting the rearranged video data from said selector in response to the clock signal.

5. A data output apparatus for a variable length decoder as set forth in claim 4, wherein said variable length-decoded video data includes a direct current value when a macro block is of an intra type, said variable length-decoded video data further including a quantization level and an escape level, said direct current value being processed together with said quantization level.

6. A data output apparatus for a variable length decoder as set forth in claim 5, wherein said video data output controller is cleared upon inputting the video data clear signal and is then operated to control said selector to output the escape level upon inputting sequentially the video data enable signal and the video data escape active signal, and to output the quantization level upon inputting only the video data enable signal.

7. A data output apparatus for a variable length decoder as set forth in claim 6, wherein said video data output controller is operated to control said selector to output the previous data if it does not input the video data clear signal again.

8. A data output apparatus for a variable length decoder as set forth in claim 1, wherein said general data output means outputs the rearranged general data according to the address value from said variable length decoding control means, and said video data output means then outputs the rearranged video data when the address value from said variable length decoding control means becomes "0".

* * * * *